United States Patent
Lee et al.

(10) Patent No.: US 7,682,851 B2
(45) Date of Patent: Mar. 23, 2010

(54) ORGANIC LIGHT EMITTING DISPLAY AND MANUFACTURING METHOD THEREOF

(75) Inventors: Young-gu Lee, Seoul (KR); Sung-kee Kang, Seongnam-si (KR); Tae-sik Oh, Suwon-si (KR); Ho-nyeon Lee, Seongnam-si (KR); Ick-hwan Ko, Seoul (KR); Young-tea Chun, Suwon-si (KR); Mi-Jeong Song, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 843 days.

(21) Appl. No.: 11/500,867

(22) Filed: Aug. 8, 2006

(65) Prior Publication Data

US 2007/0181872 A1    Aug. 9, 2007

(30) Foreign Application Priority Data

Feb. 3, 2006    (KR) .................... 10-2006-0010594

(51) Int. Cl.
  *H01L 27/15*    (2006.01)
  *H01L 29/26*    (2006.01)
  *H01L 31/12*    (2006.01)
  *H01L 33/00*    (2006.01)

(52) U.S. Cl. .................. 438/26; 257/100; 257/E33.059

(58) Field of Classification Search .................. 438/26; 257/100, E33.059
See application file for complete search history.

(56) References Cited

U.S. PATENT DOCUMENTS

| 6,268,695 | B1 | 7/2001 | Affinito |
| 7,315,047 | B2 * | 1/2008 | Kawakami et al. ............ 257/83 |
| 2001/0041270 | A1 * | 11/2001 | Maruyama et al. .......... 428/690 |

FOREIGN PATENT DOCUMENTS

KR    1020030008818    1/2003

* cited by examiner

*Primary Examiner*—David A Zarneke
*Assistant Examiner*—Jenny L Wagner
(74) *Attorney, Agent, or Firm*—Cantor Colburn LLP

(57) ABSTRACT

An organic light emitting display and a manufacturing method thereof include an improved encapsulation layer. The encapsulation layer of the organic light emitting display includes an organic layer uniformly covering bank portions and light emitting areas on a substrate; and an inorganic layer formed thicker on the light emitting areas than on the bank portions. In the organic light emitting display, the inorganic layer is thick on the light emitting area in which a sealing ability is required and the bank portion is thin in order to provide flexibility. Therefore, the encapsulation layer can be formed more easily compared to an encapsulation layer on a device in which the organic layer and inorganic layer are alternately formed at least 10 times.

10 Claims, 4 Drawing Sheets

ORGANIC LIGHT EMITTING DISPLAY AND MANUFACTURING METHOD THEREOF

This application claims priority to Korean Patent Application No. 10-2006-0010594, filed on Feb. 3, 2006, and all the benefits accruing therefrom under 35 U.S.C. §119, and the contents of which in its entirety are herein incorporated by reference.

BACKGROUND OF THE INVENTION

1. Field of the Invention

The present invention relates to an organic light emitting display, and more particularly, to an organic light emitting display having an encapsulation layer with an improved structure and a manufacturing method thereof.

2. Description of the Related Art

Generally, organic light emitting displays include an organic light emitting diode ("OLED") deposited on a thin film transistor ('TFT') of an electric circuit so that a selected emitting layer is emitted in response to a signal controlled by the TFT.

FIG. 1 shows the typical structure of such an organic light emitting display. As described above, an OLED 20, including an anode 21, a light emitting layer 22 and a cathode 23, is deposited on a TFT 10. The TFT 10 includes a substrate 11, a gate electrode 12, a source region 13, a drain region 14 and a via hole 16. Therefore, when a voltage is applied to the gate electrode 12, a current passes through the source region 13 to the drain region 14 via a channel opened in an organic semiconductor region 15. A current flows to the anode 21, the light emitting layer 22 and the cathode 23 through the via hole 16. At this time, in the light emitting layer 22, the action of emitting energy in the form of light occurs as a result of electric coupling, i.e., as a result that the light emitting layer 22 is excited by the recombination of holes and electrons. This light may be a luminous spot corresponding to one pixel of the display panel.

An encapsulation layer 30 protects the light emitting area OLED 20 from moisture and oxygen. As shown in FIG. 2, the encapsulation layer 30 has a multi-layered structure in which an inorganic film 32, such as a ceramic, and an organic film 31, such as a polymer, are alternately deposited. Such a structure is disclosed in U.S. Pat. No. 6,268,695. The organic film 31 can be composed of either of acrylic, methacrylic, polyester, polyethylene terephthalate, polyethylene, or polypropylene, etc. The inorganic film 32 can be composed of one of $In_2O_3$, $SnO_2$, ITO (Indium Tin Oxide), $SiO_2$, $Al_2O_3$, $TiO_2$, $In_2O_3$, $SnO_2$, SiN, SiC, SiON, etc. In this multi-layered structure, the inorganic film 32 prevents the penetration of oxygen and moisture and the organic film 31 provides flexibility.

The total number of layers should be at least 10 to enable the multi-layered structure, in which the organic film 31 and inorganic film 32 are alternately deposited, to properly perform the hermetic sealing and protection functions. That is, as described above, the inorganic film 32 mainly prevents the penetration of oxygen and moisture. If the thickness of the inorganic film 32 is increased, the hermetic sealing protection improves, but the flexibility is drastically decreased. As is well known, the organic light emitting display aims at being as flexible as paper that can be rolled and a decrease in flexibility is a drawback of the article. Therefore, it is preferable to include a plurality of thin inorganic films 32 between the organic films 31 with good flexibility so that the organic light emitting display has both flexibility and hermetic sealing protection. In addition, at least 10 inorganic films have to be deposited to reliably prevent the permeation of moisture and oxygen.

Because many layers have to be deposited, the manufacturing process is very complicated. In particular, since the encapsulation layer 30 is made by laminating at least 10 times, the overall manufacturing process is complicated and productivity is low.

BRIEF SUMMARY OF THE INVENTION

Exemplary embodiments of the present invention provide an improved organic light emitting display and a manufacturing method of forming an encapsulation layer having proper flexibility and sealing ability.

An exemplary embodiments of the present invention includes an organic light emitting display including: a plurality of light emitting areas between bank portions on a substrate; and an encapsulation layer covering the light emitting areas and bank portions, wherein the encapsulation layer comprises: an organic layer uniformly covering the bank portions and the light emitting areas; and an inorganic layer formed thicker on the light emitting areas than on the bank portions.

According to an exemplary embodiment of the present invention, an inorganic layer of an organic light emitting display comprises: a first inorganic film substantially uniformly deposited on the organic layer; and a second inorganic film deposited substantially only on the first inorganic film above the light emitting areas.

In exemplary embodiments, the bank portions have a recessed shape and are disposed between the light emitting portions.

Moreover, exemplary embodiments of the present invention include a manufacturing method of the organic light emitting display. The method includes: forming a plurality of light emitting areas between bank portions on a substrate; and forming an encapsulation layer covering the light emitting areas and the bank portions by uniformly covering the bank portions and the light emitting areas with an organic layer, and forming an inorganic layer to a greater thickness on the light emitting areas than the bank portions.

The forming of the inorganic film includes: forming a first inorganic film on the organic layer substantially uniformly; and forming a second inorganic film substantially only on the first inorganic film above the light emitting areas.

In exemplary embodiments, the bank portions are formed in a recess shape between the light emitting areas.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
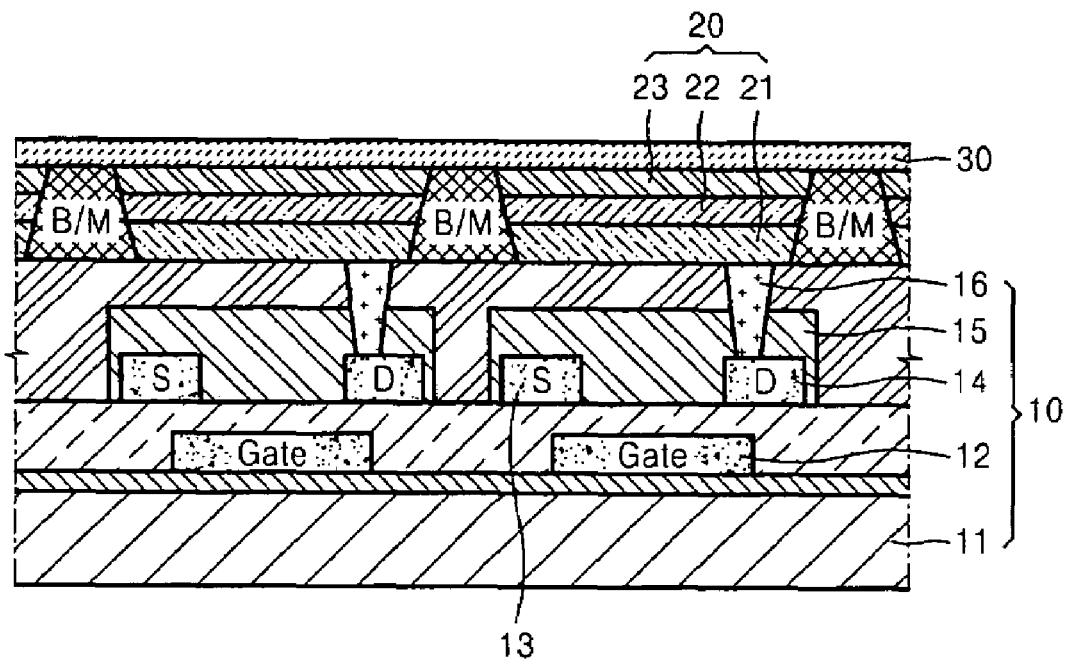
FIG. 1 is a cross-sectional view of a conventional organic light emitting display.
Figure 2:
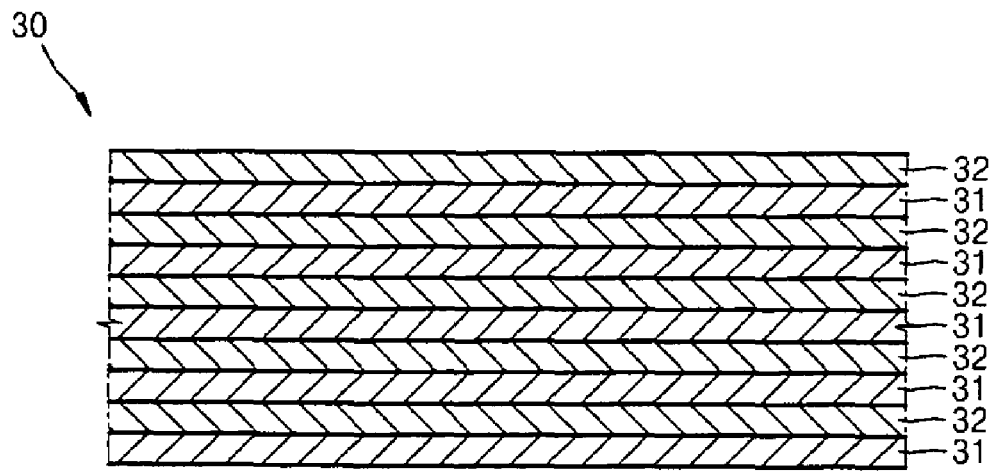
FIG. 2 is a cross-sectional enlarged view of an encapsulation layer of the organic light emitting display illustrated in FIG. 1.

Hereinafter, the present invention will be described more fully with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, lengths and sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
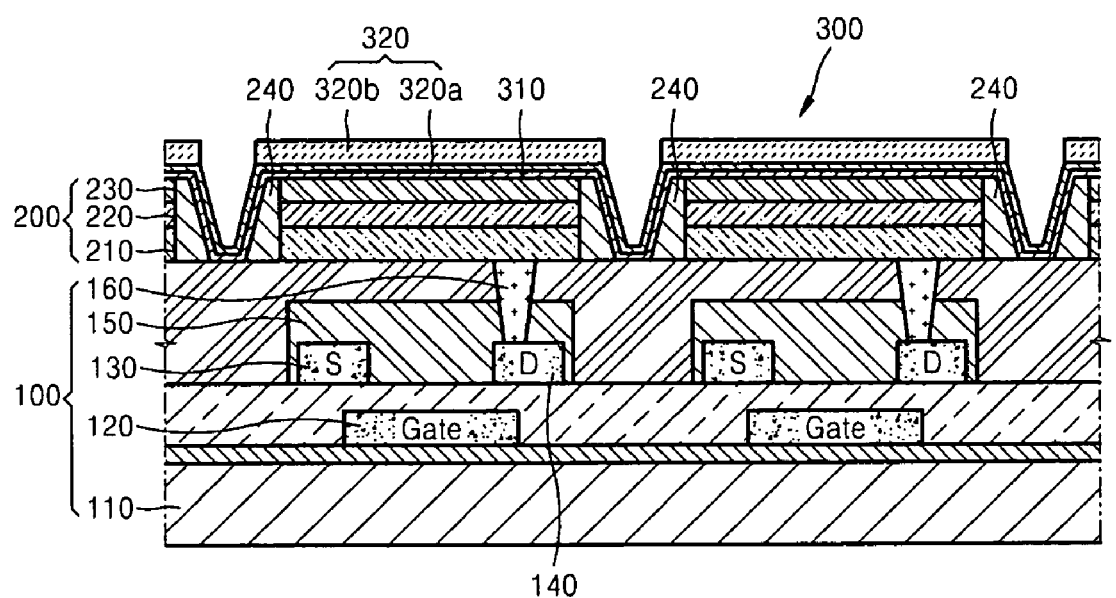
FIG. 3 is a cross-sectional view of an exemplary embodiment of an organic light emitting display according to the present invention.

FIG. 3 is a cross-sectional view of an exemplary embodiment of an organic light-emitting display according to the present invention.

Referring to FIG. 3, in the organic light emitting display of the present exemplary embodiment, an OLED 200 is deposited on a TFT layer 100. The OLED 200 includes an anode 210, a light-emitting layer 220 and a cathode 230. The TFT layer 100 includes a substrate 110, a gate electrode 120, a source region 130, a drain region 140 and a via hole 160. When a voltage is applied to the gate electrode 120, a current flows through the source region 130 to the drain region 140 via a channel formed in an organic semiconductor region 150. The current continues to the anode 210, the light emitting layer 220 and the cathode 230 through the via-hole 160, and light is produced and emitted through an encapsulation layer 300.

A bank portion 240 partitioning light emitting areas of the OLED 200 does not have a protruding structure, but is recessed. This recessed shape results in a progressive reduction of the thickness of the bank portion 240 on opposing sides forming substantially a V-shaped cut out, and thus the flexibility of the bank portion 240 is improved. That is, in the organic light emitting area corresponding to anode 210, light-emitting layer 220 and cathode 230 of OLED 200, the encapsulation layer 300 is thick as explained below, and thus it enhances sealing. The bank portion 240, which is a non-luminous portion, is as thin as possible to enhance flexibility. In other words, in the conventional structure, the flexibility and sealing properties are provided throughout the entire encapsulation layer 300, but in the present invention, the flexibility is focused on the bank portion 240 and a sealing ability is focused on the lighting emitting area of the OLED 200.

Figure 4A:
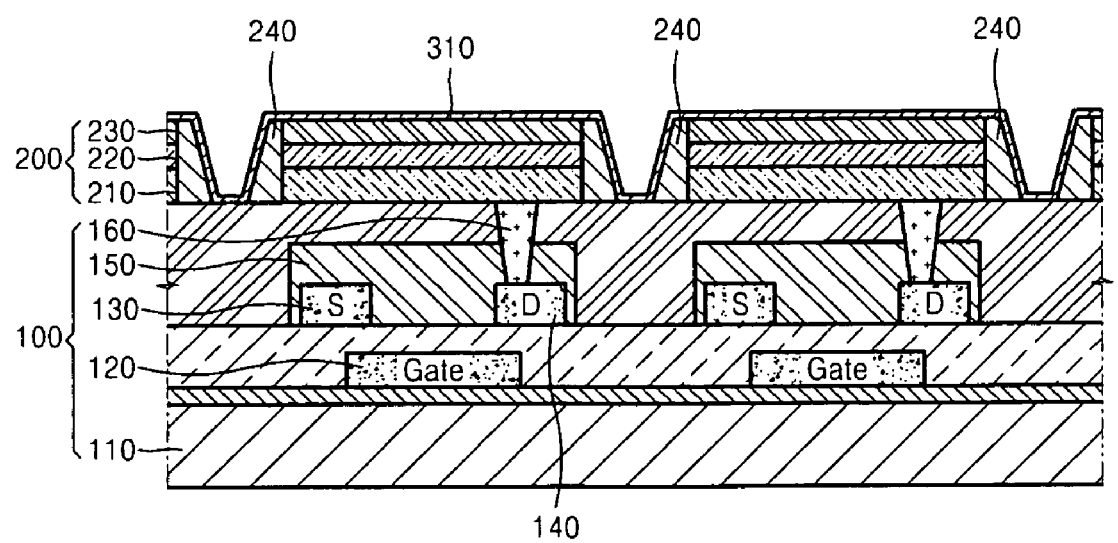
FIGS. 4A through 4C are cross-sectional views illustrating a method of forming an encapsulation layer of the organic light emitting display shown in FIG. 3.
Figure 4B:
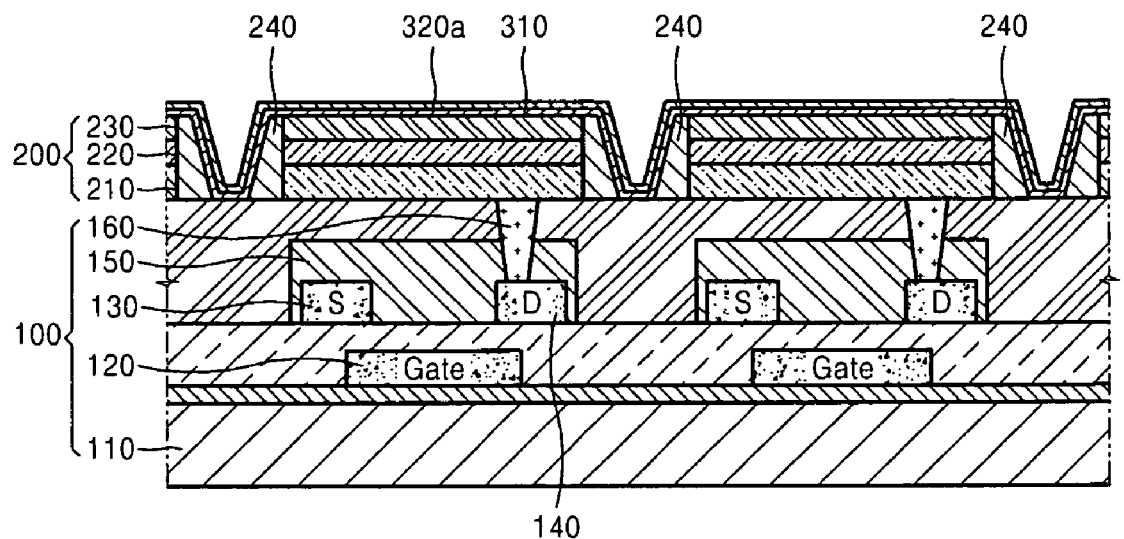
Figure 4C:
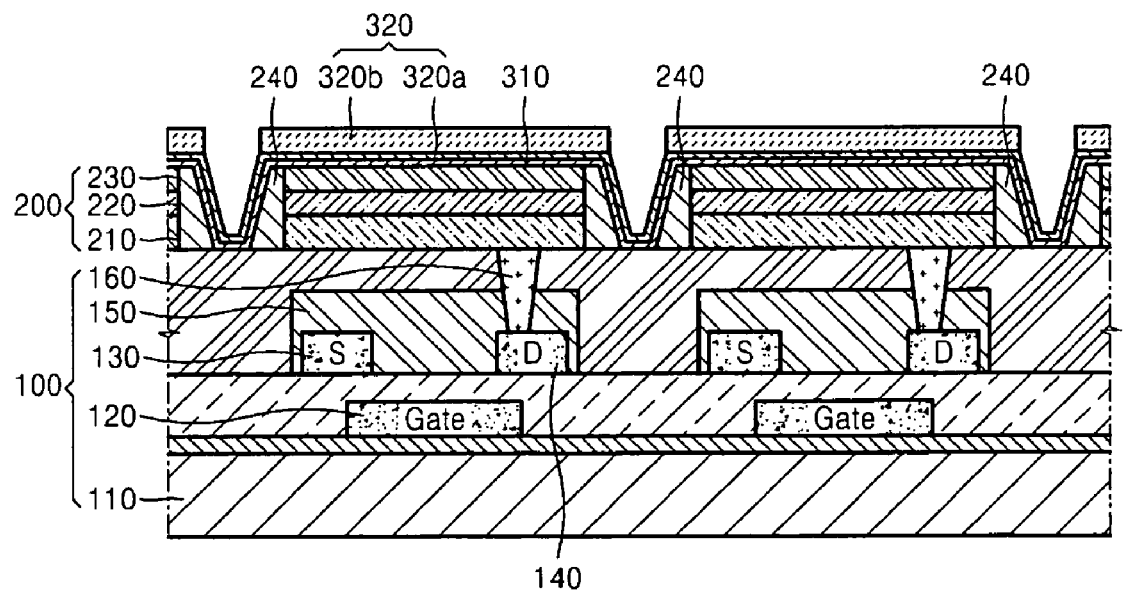

To this end, the thickness of the encapsulation layer 300 is different in the bank portion 240 and in the light emitting area corresponding to the anode 210, light-emitting layer 220 and cathode 230 of the OLED 200. FIGS. 4A through 4C illustrate a method of forming the encapsulation layer 300. First, as shown in FIG. 4A, an organic layer 310 with good flexibility is uniformly formed on the bank portion 240 and OLED 200. The organic layer 310 can be formed of one of acrylic, methacrylic, polyester polyethylene terephthalate, polyethylene, polypropylene, for example, but is not limited thereto, and can be formed by sputtering or evaporation.

Subsequently, an inorganic layer 320 having a sealing ability is formed. The inorganic layer 320 is formed in two (2) steps. First, as shown in FIG. 4B, a first inorganic film 320a is uniformly formed on the organic layer 310. The inorganic layer 320 can be formed of one of $In_2O_3$, $SnO_2$, ITO (Indium Tin Oxide), $SiO_2$, $Al_2O_3$, $TiO_2$, $In_2O_3$, $SnO_2$, SiN, SiC, SiON, for example, but is not limited thereto, and can be formed by sputtering or evaporation.

Then, a second inorganic film 320b is formed substantially only on the OLED 200 (e.g., the second inorganic film 320b is not formed in the recess or V cut outs of the bank portions 240). That is, the penetration of foreign materials like moisture and oxygen has to be prevented in the OLED 200. Therefore, the second inorganic film 320b is formed as a thick layer on the OLED 200 in order to improve sealing. The second inorganic film 320b is not formed on the bank portion 240, and thus, the organic light emitting display has good flexibility. The film is selectively formed by using a patterning process like photolithography or by using a mask.

A conventional encapsulation layer, as mentioned above, is bent as a whole because the encapsulation layer is formed having a constant thickness over the light emitting area and the bank portion 240. However, in the present embodiment, while the light emitting area is not bent much due to the thick inorganic layer 320, the bank portion 240 between the light emitting areas is flexibly bent and deformed. Therefore, the light emitting area corresponding to the anode 210, light-emitting layer 220 and cathode 230 of the OLED 200 and the bank portion 240 have the role of flexibility and sealing, respectively. In this case, there is no need for flexibility in the light emitting area. Therefore, the second inorganic film 320b can be formed to be quite thick. That is, conventionally, the inorganic film is formed repeatedly between the organic layers so as to provide flexibility. However, in the present invention, the organic layer 320 is formed in the light emitting area to a thickness required to obtain a desired sealing ability because there is little need for flexibility. Therefore, productivity can be improved while simplifying the manufacturing process.

Figure 5:
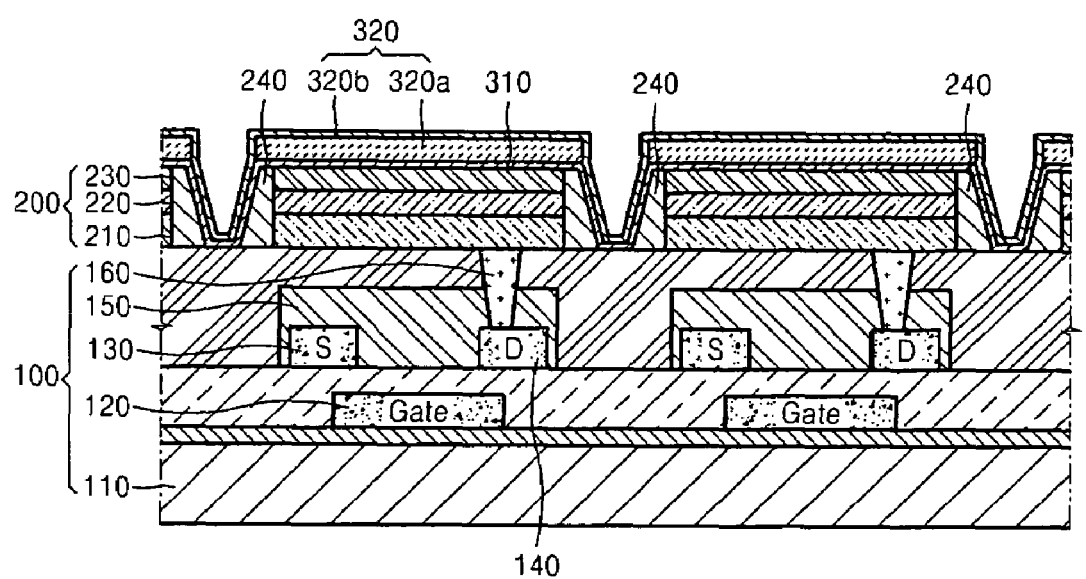
FIG. 5 is a cross-sectional view of another exemplary embodiment of an organic light emitting display according to the present invention.

FIG. 5 is a cross-sectional view of another exemplary embodiment of an organic light emitting display according to the present invention. In the drawings, like reference numerals denote elements performing like functions.

In the present exemplary embodiment of FIG. 5, like in the previous exemplary embodiment of FIGS. 4A-4C, the inorganic layer 320 is thick on the light emitting area 200 and provides a sealing property, whereas the inorganic layer 320 is thin on the bank portion 240 so as to improve flexibility.

However, the process of forming the first and second inorganic films 320a and 320b of the inorganic layer 320 is different in the present exemplary embodiment. In the present exemplary embodiment, the first inorganic film 320a is formed substantially only on the light emitting area 200 after forming the organic layer 310 and the second inorganic film 320b is substantially uniformly formed on the first inorganic film 320a.

In this case, the light emitting area corresponding to OLED 200 does not have the burden of contributing to the flexibility. Therefore, the first inorganic film 320a can be formed to a sufficient thickness to obtain desired sealing properties. As a result, since there is no need to repeatedly deposit the thin inorganic film between the organic films as in the conventional art, the manufacturing process is simpler and productivity can be greater than in the conventional art.

According to the present invention, as described above, when manufacturing the encapsulation layer of the organic light emitting display, the inorganic layer is thick on the light emitting area in which a sealing ability is required and the bank portion is thin in order to provide flexibility. Therefore, the present invention can be formed more easily than a conventional device in which the organic layer and inorganic layer are alternately formed at least 10 times.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display comprising:
   a plurality of light emitting areas between bank portions on a substrate; and
   an encapsulation layer covering the light emitting areas and bank portions, wherein each of the bank portions have a recessed shape and are each disposed between the light emitting portions, and wherein the encapsulation layer comprises:
   an organic layer uniformly covering the bank portions and the light emitting areas; and
   an inorganic layer formed thicker on the light emitting areas than on the bank portions.

2. The organic light emitting display of claim 1, wherein the inorganic layer comprises:
   a first inorganic film substantially uniformly deposited on the organic layer; and
   a second inorganic film deposited substantially only on the first inorganic film above the light emitting areas.

3. The organic light emitting display of claim 1, wherein the inorganic layer comprises:
   a first inorganic film deposited substantially only on the organic layer above the light emitting areas; and
   a second inorganic film uniformly deposited on the organic layer and the first inorganic film.

4. The organic light emitting display of claim 1, wherein the recessed shape results in a progressive reduction of a thickness of each bank portion on opposing sides forming substantially a V-shaped cut out.

5. The organic light emitting display of claim 1, wherein the organic layer is formed of one of acrylic, methacrylic, polyester polyethylene terephthalate, polyethylene or polypropylene.

6. The organic light emitting display of claim 1, wherein the inorganic layer is formed of one of $In_2O_3$, $SnO_2$, ITO (Indium Tin Oxide), $SiO_2$ $Al_2O_3$, $TiO_2$, $In_2O_3$, $SnO_2$, SiN, SiC, or SiON.

7. A manufacturing method of an organic light emitting display including:
   forming a plurality of light emitting areas and a plurality of bank portions on a substrate, contiguous light emitting areas having a corresponding bank portion therebetween, wherein each of the bank portions are formed in a recess shape between contiguous light emitting areas; and
   forming an encapsulation layer covering the light emitting areas and the bank portions by uniformly covering the bank portions and the light emitting areas with an organic layer, and forming an inorganic layer to a greater thickness on the light emitting areas than the bank portions.

8. The manufacturing method of claim 7, wherein the forming of the inorganic film includes:
   forming a first inorganic film on the organic layer substantially uniformly; and
   forming a second inorganic film substantially only on the first inorganic film above the light emitting areas.

9. The manufacturing method of claim 7, wherein the forming of the inorganic film includes:
   forming a first inorganic film substantially only on the organic layer above the light emitting areas; and
   forming a second inorganic film on the organic layer and the first inorganic film substantially uniformly.

10. The manufacturing method of claim 8, wherein the recessed shape results in a progressive reduction of a thickness of each bank portion on opposing sides forming substantially a V-shaped cut out.

* * * * *